United States Patent
Arendt

(10) Patent No.: US 7,439,608 B2
(45) Date of Patent: Oct. 21, 2008

(54) SYMMETRIC BIPOLAR JUNCTION TRANSISTOR DESIGN FOR DEEP SUB-MICRON FABRICATION PROCESSES

(75) Inventor: Kevin E. Arendt, Folsom, CA (US)

(73) Assignee: Intel Corporation, Santa Clara, CA (US)

( * ) Notice: Subject to any disclaimer, the term of this patent is extended or adjusted under 35 U.S.C. 154(b) by 91 days.

(21) Appl. No.: 11/525,737

(22) Filed: Sep. 22, 2006

(65) Prior Publication Data

US 2008/0087918 A1    Apr. 17, 2008

(51) Int. Cl.
*H01L 27/082* (2006.01)
(52) U.S. Cl. ........................ 257/592; 438/309
(58) Field of Classification Search ............... 257/565, 257/592; 438/309
See application file for complete search history.

(56) References Cited

U.S. PATENT DOCUMENTS

| | | | |
|---|---|---|---|
| 3,935,587 A * | 1/1976 | Ostop et al. | 257/47 |
| 5,528,064 A | 6/1996 | Thiel et al. | |
| 5,541,439 A * | 7/1996 | Mojaradi et al. | 257/488 |
| 5,605,850 A | 2/1997 | Villa | |
| 5,614,424 A | 3/1997 | Wong et al. | |

OTHER PUBLICATIONS

PCT/US2007/020289 Sep. 19, 2007 International Search Report.

* cited by examiner

*Primary Examiner*—Mark Prenty
(74) *Attorney, Agent, or Firm*—Blakely, Sokoloff, Taylor & Zafman LLP

(57) ABSTRACT

Described herein are embodiments of a bipolar junction transistor including a plurality of base terminal rings having an emitter terminal ring between any two base terminal rings of the plurality of base terminal rings, and a collector terminal ring surrounding the plurality of base terminal rings and the emitter terminal ring and methods of manufacturing the same.

17 Claims, 5 Drawing Sheets

SYMMETRIC BIPOLAR JUNCTION TRANSISTOR DESIGN FOR DEEP SUB-MICRON FABRICATION PROCESSES

BACKGROUND OF THE INVENTION

1. Field of the Invention the present invention relates to the field of semiconductor devices and more specifically to a bipolar junction transistor structure and its method of fabrication.

2. Discussion of Related Art

In bipolar junction transistor (BJT) design the need for device symmetry is necessary to ensure optimum device performance and optimal matching between devices. Proper matching between connected devices, allows the use of averaging techniques to cancel out linear and non-linear gradients induced by manufacturing processes. Averaging can be applied to the bipolar junction transistor by arranging stripes or rectangles of alternating diffusion types that constitute the bipolar junction transistor. Further improvements can be achieved with symmetry. Such averaging techniques allow a bipolar junction transistor to be used in high precision circuits such as bandgap voltage references, thermal sensors, and on-die thermal calibration devices. to maintain symmetry in a traditional bipolar junction transistor design, the emitter terminal is typically drawn as a square with the base terminal surrounding the emitter terminal. Moreover, the traditional bipolar junction transistor also includes a collector terminal that typically surrounds the emitter terminal.

As the drive to produce smaller devices in integrated circuit design continues, the result of producing smaller devices brings about new design constraints that affect the operating characteristics of certain devices. Despite the adverse effect of impacting operating characteristics of certain devices, these design constraints are necessary to ensure uniformity through out the manufacturing process of semiconductor devices. the uniformity in the manufacturing process aids in ensuring high yields in high-volume manufacturing especially in deep-submicron semiconductor manufacturing processes. to ensure the uniformity in semiconductor manufacturing processes, some design constraints restrict the physical dimensions of devices such as a bipolar junction transistor. For example, in a deep-submicron fabrication process restrictions are necessary on certain dimensions that can be drawn on a mask for a given device to ensure high yields and reliability of a manufactured integrated circuit. In some processes the maximum width dimension of a diffusion region is restricted.

Because a bipolar junction transistor requires a certain area for a particular bias current to ensure desirable operating characteristics, the restricted width of a diffusion region forces the length of the device to be greater than the width. therefore, the traditional square bipolar junction transistor having a square emitter terminal that are used in semiconductor circuit designs must be adapted to adhere to the maximum width dimensions. When adhering to the maximum width dimensions the traditional bipolar junction transistor having a square emitter terminal must now have a longer length than the width to maintain the required area to operate efficiently. the shape of the bipolar junction transistor now takes on the shape of a rectangle. the non-symmetric shape of a rectangular bipolar junction transistor changes the characteristics of the transistor degrading the transistors operating characteristics and the matching characteristics of the transistor between other devices.

SUMMARY

Described herein are embodiments of a bipolar junction transistor including a plurality of base terminal rings having an emitter terminal ring between any two base terminal rings of the plurality of base terminal rings, and a collector terminal ring surrounding the plurality of base terminal rings and the emitter terminal ring and methods of manufacturing the same.

DETAILED DESCRIPTION

In the following description numerous specific details are set forth in order to provide an understanding of the claims. One of ordinary skill in the art will appreciate that these specific details are not necessary in order to practice the disclosure. In other instances, well-known semiconductor fabrication processes and techniques have not been set forth in particular detail in order to not unnecessarily obscure embodiments of the present invention.

Figure 1:
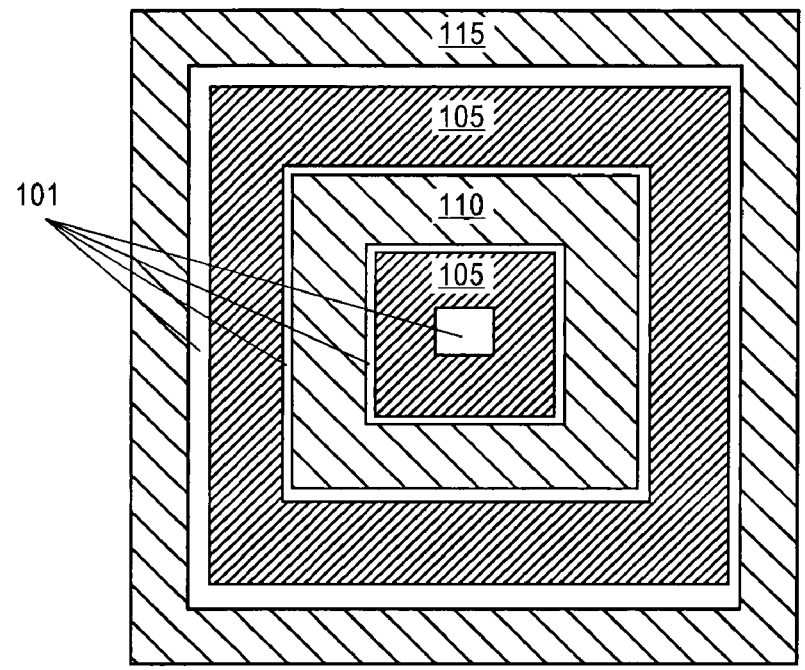
FIG. 1 illustrates an overhead view of an embodiment of a ring bipolar junction transistor.

Embodiments of the present invention include a design of a bipolar junction transistor (BJT) and a manufacturing process thereof that preserves symmetry of a bipolar junction transistor while conforming to design constraints including a restriction on a maximum dimension of a diffusion region in either the X or Y direction. The design uses a ring geometry to preserve symmetry of a bipolar junction transistor while adhering to design constraints of a semiconductor fabrication process such as a maximum diffusion width dimension. FIG. 1 illustrates an embodiment of a ring bipolar junction transistor 100 that includes two base terminal rings 105, an emitter terminal ring 110, and a collector terminal ring 115 defined by diffusion regions.

the ring geometry provides the area and the periphery of a ring bipolar junction transistor 100 to be dimensioned independently of each other despite a design constraint restricting a maximum dimension of diffusion regions. For example, when an embodiment of the ring bipolar junction transistor 100 is designed to have base terminal, emitter terminal, and collector terminal rings formed in the shape of a square, the width may be adjusted between the allowed minimum and maximum dimension along with the length of the square ring to adjust the area to periphery ratio of the transistor. For an embodiment of a ring bipolar junction transistor 100the dimensions are designed so that the transistor has an area to perimeter ratio of one-half.

the symmetry of a ring bipolar junction transistor 100 gives the bipolar junction transistor optimized device characteristics, such as better relative matching between devices over a non-symmetric rectangular geometry. Moreover, the symmetry of a ring bipolar junction transistor 100 allows the transistor to be rotated in any direction without greatly affecting the operating characteristics of a ring bipolar junction transistor 100. Because the operating characteristics are not dependent on the orientation of the device, this provides more flexibility for placement of a ring bipolar junction transistor 100 on a semiconductor die.

Furthermore, the ring layout reduces the parasitic base resistance compared to the traditional square and rectangular bipolar junction transistor geometries. For an embodiment of a ring bipolar junction transistor 100, the use of multiple base terminal rings 105 increases the paths for electrons or holes to travel to and from the emitter terminal ring 110. Because the number of paths are increased the resistance between the emitter and the base is decreased. this reduction in the parasitic base resistance provides a ring bipolar junction transistor 100 with improved device characteristics over traditional geometries. One such benefit of the reduced parasitic base resistance of a ring bipolar junction transistor 100 includes an improved current gain factor. For an embodiment of a ring bipolar junction transistor 100, the parasitic base resistance is reduced by one-half the value of a traditional bipolar junction transistor. Similarly, for an embodiment of a ring bipolar junction transistor such as the embodiment shown in FIG. 3, the parasitic base resistance reduces as additional rings are added. Extending this approach results in an averaging effect of the parasitic base resistance and current factor. The effect of averaging within a ring bipolar junction transistor results in an improvement in the relative matching among several "unit" bipolar junction transistors arranged in an array, such as the embodiment shown in FIG. 4.

The relative matching characteristics and the reduced base resistance of embodiments of a ring bipolar junction transistor 100 make the transistor well suited to be used in precision diode circuits. For an embodiment of a ring bipolar transistor 100 to be used as a precision diode, the base terminal rings 110 and the collector terminals ring 115 are connected together. This diode configuration can then be used in circuits such as a bandgap voltage reference. Moreover, the relative matching characteristics and the reduced base resistance of embodiments make the ring bipolar junction transistor 100 ideal for use in thermal sensing circuitry such as a thermal sensor used to extract the absolute junction temperature of a chip. The above uses of embodiments of a ring bipolar junction transistor 100 are only offered by way of example and not as limitations.

FIG. 1 illustrates an embodiment of a ring style layout for a bipolar junction transistor. The FIG. 1 embodiment includes two base terminal rings 105 and an emitter terminal ring 110 between the two base terminal rings 105. Furthermore, the FIG. 1 embodiment includes a collector terminal ring 115 that ecompasses the emitter terminal ring 110 and the base terminal rings 105.the rings of the base terminal ring 105, emitter terminal ring 110, and collector terminal ring 115 may form any symmetric geometrical shape. For an embodiment, the base terminal ring 105, emitter terminal ring 110, and collector terminal ring 115 form the shape of a square. Another embodiment includes a base terminal ring 105, emitter terminal ring 110, and collector terminal ring 115 thatformthe shape of a circle.

For an embodiment, the inner base terminal ring 105 is formed around a shallow trench isolation (STI) region 101. Moreover, embodiments may include shallow trench isolation regions 101 between an emitter terminal ring 110 and each base terminal ring 105. Similarly, embodiments may also include a shallow trench isolation region 101 between the collector terminal ring 115 and a base terminal ring 105. For an embodiment including shallow trench isolation regions 101, the width of the base terminal rings 105, emitter terminal ring 110, and collector terminal ring 115 are drawn the same based on the design constraints of the diffusion widths to ensure uniformity of a given deep-submicron manufacturing process. The width of the base terminal rings 105, emitter terminal ring 110, and collector terminal ring 115 are all 1 micrometer for an embodiment. Another embodiment including shallow trench isolation regions 101, the width of the base terminal rings 105, emitter terminal ring 110, and collector terminal ring 115 are drawn such that the base terminal rings 105, the emitter terminal ring 110, and the collector terminal ring 115 are not all drawn to the same width.

Figure 2:
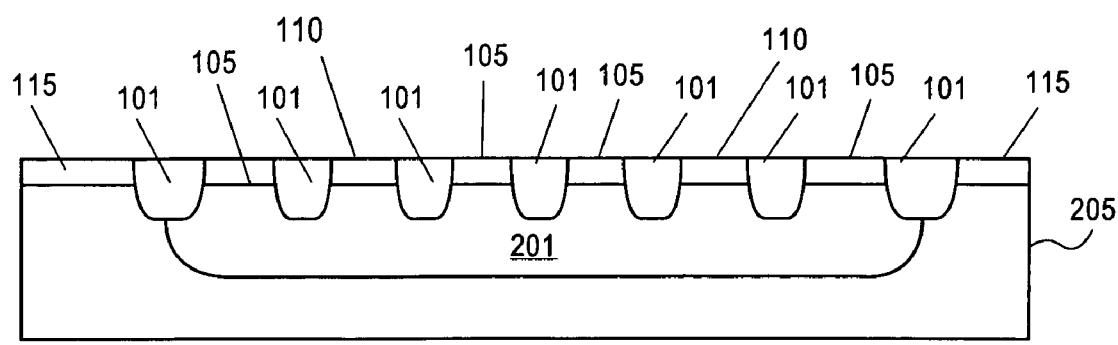
FIG. 2 illustrates a cross-sectional view of an embodiment of a ring bipolar junction transistor.

FIG. 2 illustrates a cross-sectional view of a ring bipolar junction transistor having base terminal rings 105 and an emitter terminal ring 110 formed in a well 201 within a substrate 205. For a PNP embodiment of a ring bipolar junction transistor 100, well 201 is doped to form an N-well in a P-type substrate. For an NPN embodiment of a ring bipolar juction transistor 100, well 201 is doped to form a P-well in an N-type substrate. For an embodiment, well 201 is doped to have a concentration of $1\times10^{16}$-$1\times10^{19}$ atoms/cm$^3$. Embodiments of a ring bipolar junction transistor 100 include wells 201 with a depth that range from 0.05 micro meters to 0.25 micrometers. An embodiment includes a well 201 having a depth of 0.1 micrometers.

Moreover, the FIG. 2 embodiment includes diffusion regions creating base terminal rings 105, an emitter terminal ring 110, and a collector terminal ring 115. For a PNP embodiment, base terminal rings 105 are formed from an N+ doped diffusion region and the emitter terminal ring 110 and the collector terminal ring 115 are formed from P+ doped diffusion regions. For an NPN embodiment, the base terminal rings 105 are formed from P+ doped diffusion regions and the emitter terminal ring 110 and the collector terminal ring 115 are formed from N+ doped diffusion regions. For some NPN and PNP type embodiments diffusion regions for a base terminal ring 105, an emitter terminal ring 110, and a collector terminal ring 115 are doped to a concentration of $1\times10^{19}$-$1\times10^{21}$ atoms/cm$^3$.

Figure 3:
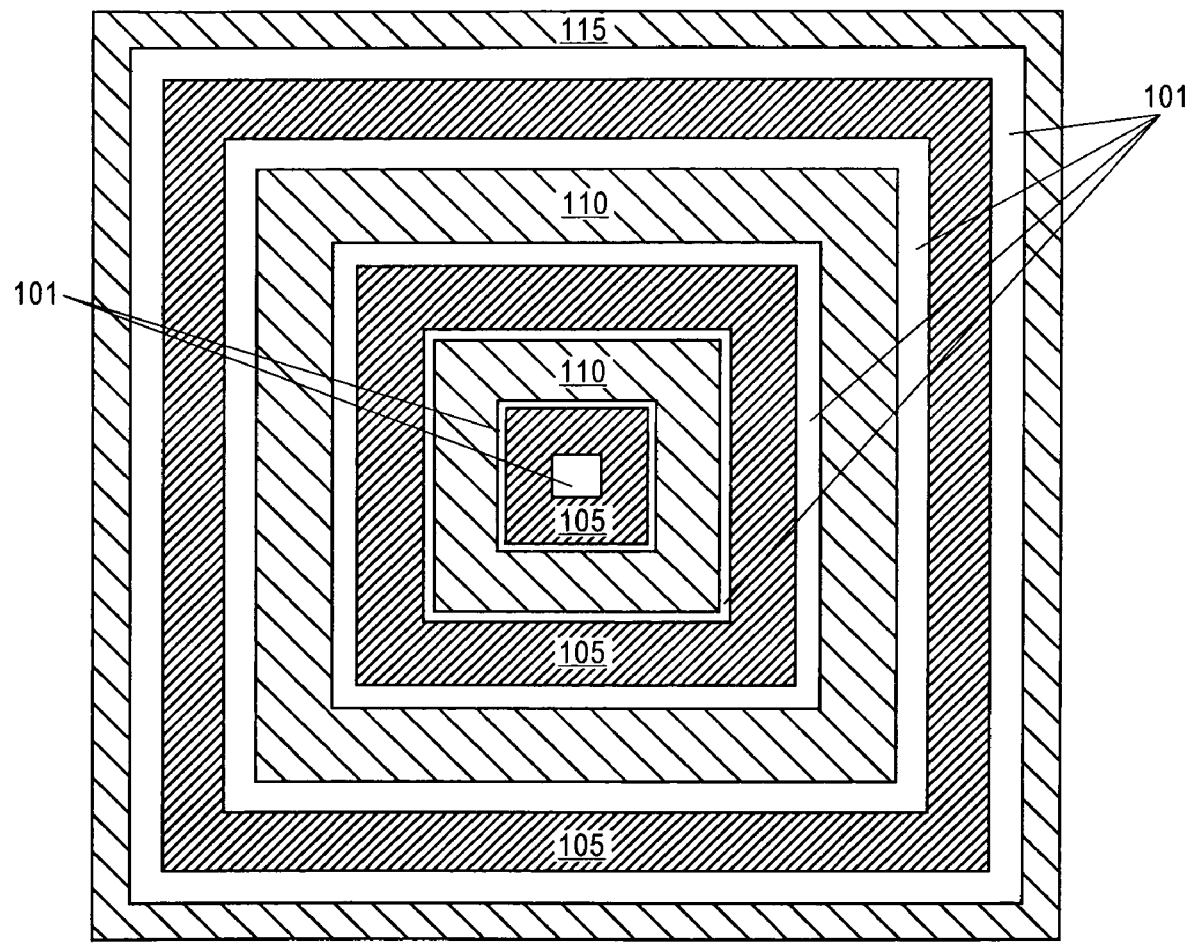
FIG. 3 illustrates an overhead view of an embodiment of a ring bipolar junction transistor.

Embodiments of a bipolar junction transistor according to the present invention may include several base terminal rings 105 and several emitter terminal rings 110. In one such embodiment as illustrated in FIG. 3, the ring bipolar junction transistor 100 includes three base terminal rings 105 and two emitter terminal rings 110 surrounded by a collector terminal ring 115.therefore, a collector terminal ring 115 may surround any number of emitter terminal rings 110 and base terminal rings 105 as long as an emitter terminal ring 110 surrounds a base terminal ring 105 and is contained by a base terminal ring 105.

Figure 4:
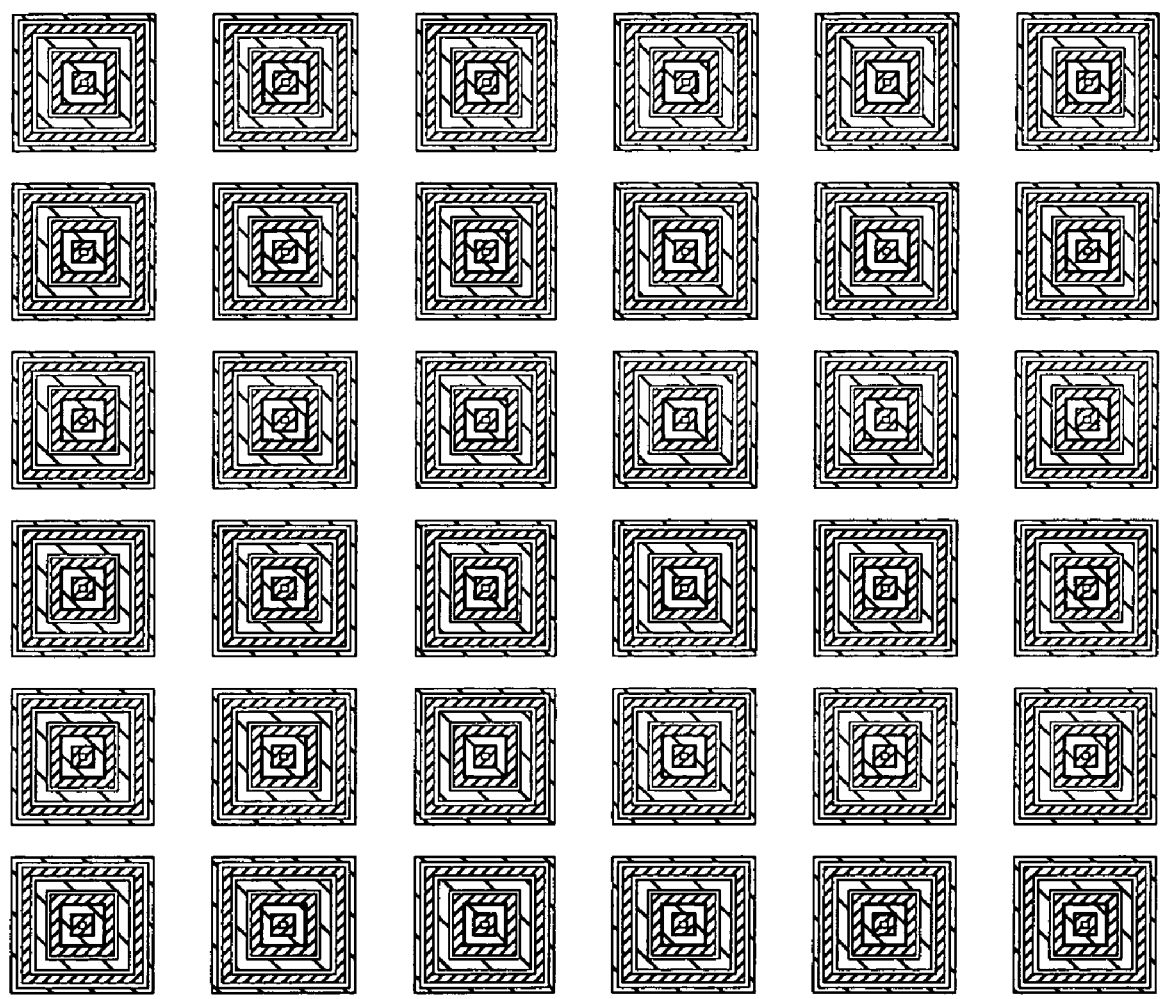
FIG. 4 illustrates an array of an embodiment of a ring bipolar junction transistor.

FIG. 4 illustrates an embodiment of an array of ring bipolar junction transistors 100. In an embodiment of an array of ring bipolar junction transistors 100, several ring bipolar transistors 100 of the array may be connected in parallel to perform as a single transistor. The symmetric nature of the ring bipolar junction transistor 100 provides matching characteristics between other ring bipolar junction transistors 100 that allow averaging techniques to cancel linear and non-linear gradients induced by manufacturing processes. An embodiment of an array of ring bipolar junction transistors 100 includes connecting transistors in an array to use averaging techniques such as common-centroid layout. Embodiments of the ring bipolar junction transistor 100 formed into an array may form arrays including any number of ring bipolar junction transistors 100. For example, embodiments of a ring bipolar junction transistor 100 formed in an array configuration include a three by three, a ten by ten, or a sixteen by sixteen array of ring bipolar junction transistors 100.

Figure 5A:
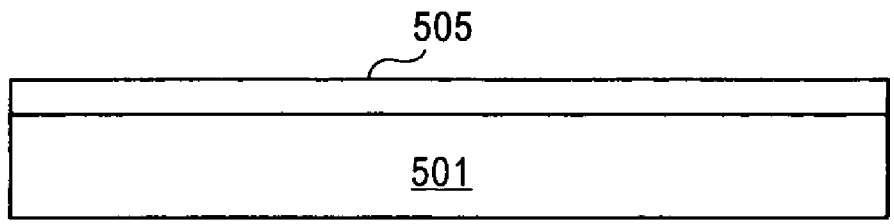
FIGS. 5A-5H illustrate a method of fabricating an embodiment of a ring bipolar junction transistor according to one embodiment.
Figure 5B:
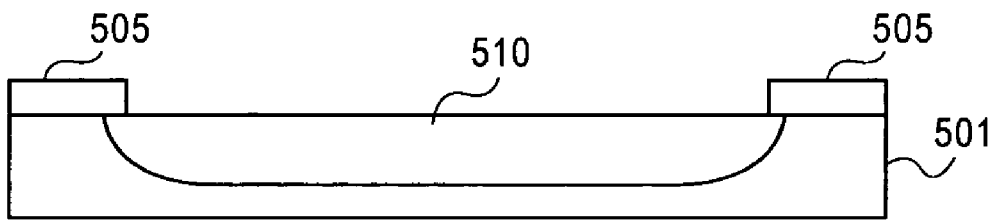

FIGS. 5A-5H illustrate the formation of an embodiment of a ring bipolar junction transistor 100. For an embodiment, a substrate 501 is formed and a first masking layer 505 is formed over the substrate 501, as illustrated in FIG. 5A. For a PNP embodiment the substrate 501 is a P-type substrate. Alternatively, for an NPN embodiment, the substrate 501 is an N-type substrate. The first masking layer 505 may be any well-known material suitable for defining a well 510. For an embodiment, a first masking layer 505 is a lithographically defined photoresist. For another embodiment, first masking layer 505 is formed of a dielectric material that has been lithographically defined and then etched. For a certain embodiment, first masking layer 505 may be a composite stack of materials. First masking layer 505 is then patterned to define a region of the substrate 501 that impurities will be added into to form a well 510. FIG. 5B illustrates an embodiment where a well 510 was formed in a substrate 501 through the addition of impurities through methods such as ion implantation or thermal diffusion. For an embodiment, a well 510 is formed in a p-type substrate 501 when doped with N+ dopants to form an N-well. Another embodiment includes using P-type dopants to form a P-well in an n-type substrate 501.

Figure 5C:
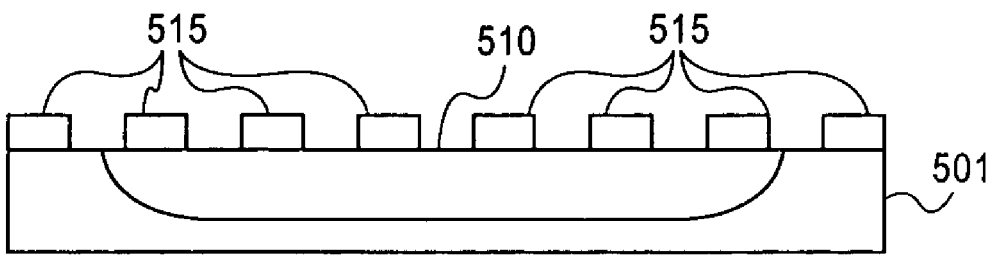
Figure 5D:
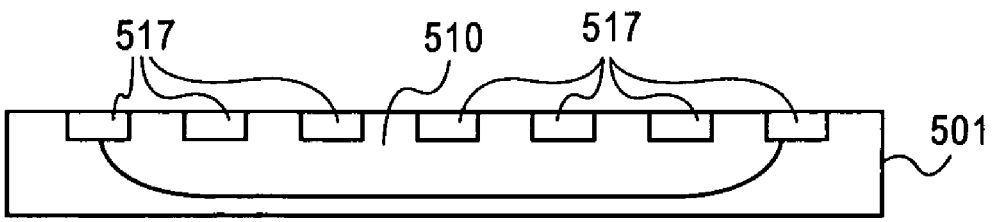

After a well 510 is formed, first masking layer 505 is removed. For an embodiment first masking layer 505 is removed using a dry etch. For another embodiment first masking layer 505 is removed using a wet etch. Once first masking layer 505 is removed, an embodiment includes a second masking layer 515 that is formed and pattered over substrate 501 and well 510. Second masking layer 515 is used to define shallow trench isolation (STI) regions 517.the areas left exposed by second masking layer 515, as shown in FIG. 5C, are etched to form trenches. For an embodiment, the trenches are etched to form shallow trench isolation (STI) regions 517 half the depth of well 510.trenches, for an embodiment, may be etched using an anisotropic plasma etch. The trenches are then filled with a dielectric material. For an embodiment, trenches are filled by blanket depositing an oxide, for example, by using a high-density plasma (HDP) chemical deposition process. The deposition process will also form dielectric on the top surfaces of the patterned second mask layer 515.the dielectric material is then polished to make the top of the dielectric material forming the shallow trench isolation regions 517 approximately planar with well 510 and a substrate 501 as illustrated in FIG. 5D. the polishing of the oxide may be carried out using any polishing technique including chemical, mechanical, or electromechanical polishing techniques.

Figure 5E:
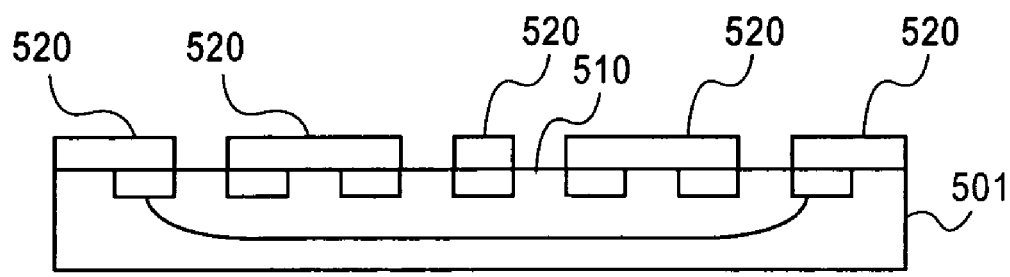
Figure 5F:
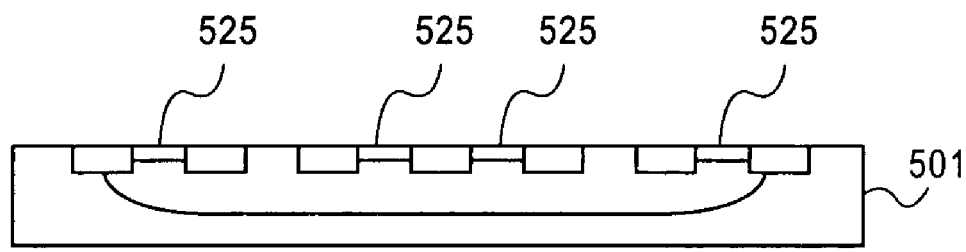
Figure 5G:
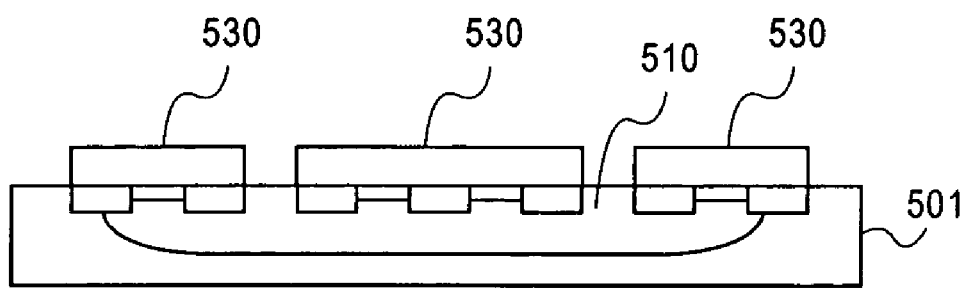
Figure 5H:
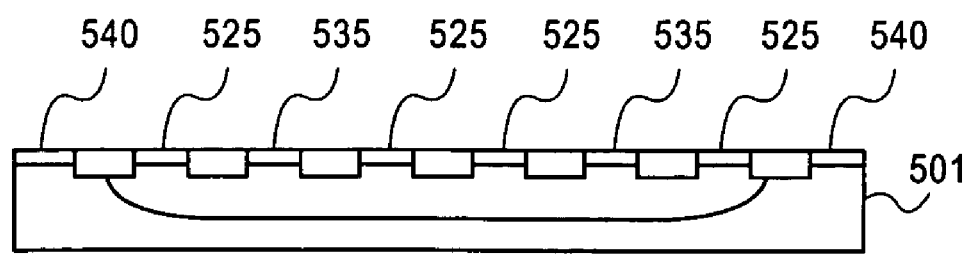

As FIG. 5E illustrates a third masking layer 520 is formed and patterned to define base regions 525 of the ring bipolar junction transistor 100. Once a third masking layer 520 is patterned, the exposed areas are doped to create a base region 525 in a well 510, as shown in FIG. 5F,to form the base terminal rings 105 of an embodiment of a ring bipolar junction transistor 100. For a PNP embodiment an N-type dopant, such as phosphorous, arsenic, or antimony, is used to form an N+ base region 525. For an NPN embodiment, a P-type dopant, such as boron, is used to form a P+ base region 525 within a well 510 that is doped with a p-type dopant in an n-type substrate 501.the doping may be done using any doping techniques including thermal diffusion and ion implantation. An etching technique similar to the techniques previously discussed to remove the other masking layers is then used to remove third masking layer 520. As shown in FIG. 5G, a fourth masking layer 530 is formed and patterned to define emitter regions 535 and collector regions 540 of the ring bipolar junction transistor 100.the area left exposed by fourth masking layer 530 is then doped. For a PNP embodiment, a P-type dopant is used to form P+ emitter regions 535 and collector regions 540. For an NPN embodiment, an N-type dopant is used to form N+ emitter regions 535 and collector regions 540. For an embodiment, once emitter regions 535 and collector regions 540 are formed the fourth masking layer 530 is removed to form an embodiment of a ring bipolar junction transistor 100the cross-section of which is shown in FIG. 5H. At this point all that remains is to form device interconnections.

Although embodiments of the present invention have been described in language specific to structural features and/or methodological acts, it is to be understood that the embodiments of the present invention defined in the appended claims are not necessarily limited to the specific features or acts described. Rather, the specific features and acts are disclosed as particularly graceful implementations of the claimed invention.

We claim:
1. A bipolar junction transistor comprising:
   a plurality of base terminal rings having an emitter terminal ring between any two base terminal rings of said plurality of base terminal rings; and
   a collector terminal ring surrounding said plurality of base terminal rings and said emitter terminal ring, wherein said plurality of base terminal rings having an emitter terminal ring between any two base terminal rings of said plurality of base terminal rings is formed in an N-well.
2. The bipolar junction transistor of claim 1 wherein said plurality of base terminal rings are N+ doped regions and said emitter terminal ring is a P+ doped region.
3. The bipolar junction transistor of claim 1 wherein said plurality of base terminal rings, said emitter terminal ring, and said collector terminal ring are separated by a shallow trench isolation region.
4. A bipolar junction transistor comprising:
   a plurality of base terminal rings having an emitter terminal ring between any two base terminal rings of said plurality of base terminal rings; and
   a collector terminal ring surrounding said plurality of base terminal rings and said emitter terminal ring, wherein the bipolar junction transistor is part of an array of bipolar junction transistors.
5. The bipolar junction transistor of claim 4 wherein said array of bipolar junction transistors is part circuit selected from the group consisting of a bandgap voltage reference, a thermal sensor, and a on-die thermal calibration device.
6. A bipolar junction transistor comprising:
   a plurality of base terminal rings having an emitter terminal ring between any two base terminal rings of said plurality of base terminal rings; and
   a collector terminal ring surrounding said plurality of base terminal rings and said emitter terminal ring, wherein said plurality of base terminal rings, said emitter ring, and said collector rings form the shape of a square.
7. A bipolar junction transistor comprising:
   a first base terminal ring;
   an emitter terminal ring formed around said first base terminal ring;
   a second base terminal ring formed around said emitter terminal ring; and a collector terminal ring formed outside of said second base terminal ring, wherein said first base terminal ring and said second base terminal ring are N+ doped regions.

8. A bipolar junction transistor comprising:
a first base terminal ring;
an emitter terminal ring formed around said first base terminal ring;
a second base terminal ring formed around said emitter terminal ring; and
a collector terminal ring formed outside of said second base terminal ring, wherein said first base terminal ring, said emitter terminal ring, and said second base terminal ring are separated by a shallow trench isolation region.

9. The bipolar junction transistor of claim 8 wherein said first base terminal ring, said emitter terminal ring, and said second base terminal ring are formed in the shape of a square.

10. The bipolar junction transistor of claim 9 wherein said bipolar transistor is part of a bandgap voltage reference circuit.

11. The bipolar junction transistor of claim 9 wherein said width of said first base terminal ring, said emitter terminal ring, said second base terminal ring, and said collector terminal ring is 1 micrometer.

12. The bipolar junction transistor of claim 8 wherein said first base terminal ring, said emitter terminal ring, and said second base terminal ring are formed in a P-well.

13. A method comprising:
forming a well within a substrate;
forming a base terminal having a plurality of rings within said well;
forming an emitter terminal ring between any two of said plurality of rings; and
forming a collector terminal ring that encompasses said base terminal and said emitter terminal ring, wherein said substrate is a p-type substrate and said well is an N-well.

14. A method comprising:
forming a well within a substrate;
forming a base terminal having a plurality of rings within said well;
forming an emitter terminal ring between any two of said plurality of rings; and
forming a collector terminal ring that encompasses said base terminal and said emitter terminal ring further comprising forming shallow trench isolation regions to separate said first ring, said second ring, said emitter terminal ring, and said collector terminal ring.

15. The method of claim 14 wherein forming shallow trench isolation regions includes forming said shallow trench isolation regions at approximately half a depth of said well.

16. The method of claim 13 wherein forming said emitter terminal ring and forming said collector terminal ring comprises forming P+ doped regions.

17. A method comprising:
forming a well within a substrate;
forming a base terminal having a plurality of rings within said well;
forming an emitter terminal ring between any two of said plurality of rings; and
forming a collector terminal ring that encompasses said base terminal and said emitter terminal ring used to form an array of ring bipolar junction transistors.

* * * * *